US011230617B2

(12) United States Patent
Arai et al.

(10) Patent No.: US 11,230,617 B2
(45) Date of Patent: Jan. 25, 2022

(54) RESIN COMPOSITION

(71) Applicant: NAMICS CORPORATION, Niigata (JP)

(72) Inventors: Fuminori Arai, Niigata (JP); Kazuki Iwaya, Niigata (JP)

(73) Assignee: NAMICS CORPORATION, Niigata (JP)

( * ) Notice: Subject to any disclaimer, the term of this patent is extended or adjusted under 35 U.S.C. 154(b) by 106 days.

(21) Appl. No.: 16/759,886

(22) PCT Filed: Oct. 30, 2018

(86) PCT No.: PCT/JP2018/040337
§ 371 (c)(1),
(2) Date: Apr. 28, 2020

(87) PCT Pub. No.: WO2019/088102
PCT Pub. Date: May 9, 2019

(65) Prior Publication Data
US 2020/0283551 A1    Sep. 10, 2020

(30) Foreign Application Priority Data

Oct. 31, 2017   (JP) .............................. JP2017-211302

(51) Int. Cl.
*H01L 21/00*        (2006.01)
*C08F 22/10*        (2006.01)
(Continued)

(52) U.S. Cl.
CPC ................. *C08F 22/10* (2013.01); *C09J 4/00* (2013.01); *C09J 11/06* (2013.01); *H01L 27/14618* (2013.01); *H01L 27/14683* (2013.01)

(58) Field of Classification Search
CPC .......... H01L 27/14618; H01L 27/14683; C08J 3/242; C09J 4/00; C09J 11/06; C08F 22/10
(Continued)

(56) References Cited

U.S. PATENT DOCUMENTS 4,160,864 A    7/1979   Ponticello et al.
9,181,365 B2   11/2015  Malofsky et al.
(Continued)

FOREIGN PATENT DOCUMENTS

EP    2926368 A1    10/2015
JP    S5331740 A    3/1978
(Continued)

OTHER PUBLICATIONS

International Search Report (ISR) (and English translation thereof) dated Dec. 24, 2019 issued in International Application No. PCT/JP2019/039628.
(Continued)

*Primary Examiner* — Brook Kebede
(74) *Attorney, Agent, or Firm* — Holtz, Holtz & Volek PC

(57) ABSTRACT

A resin composition contains a 2-methylene-1,3-dicarbonyl compound and an initiator. The 2-methylene-1,3-dicarbonyl compound has a molecular weight of 180 to 10,000, and the initiator contains a basic substance having a $pK_a$ of 8 or
(Continued)

greater. The 2-methylene-1,3-dicarbonyl compound contains a structural unit represented by the following formula (I)

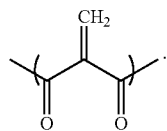

16 Claims, 1 Drawing Sheet

(51) Int. Cl.
   *C09J 4/00* (2006.01)
   *C09J 11/06* (2006.01)
   *H01L 27/146* (2006.01)
(58) Field of Classification Search
   USPC .................................................. 438/124, 126
   See application file for complete search history.

(56) References Cited

U.S. PATENT DOCUMENTS

| | | | | |
|---|---|---|---|---|
| 9,249,265 | B1* | 2/2016 | Stevenson | C08L 33/04 |
| 9,279,022 | B1 | 3/2016 | Palsule et al. | |
| 9,676,875 | B2 | 6/2017 | Palsule et al. | |
| 9,752,059 | B2* | 9/2017 | Malofsky | C09J 5/00 |
| 9,790,295 | B2 | 10/2017 | Sullivan et al. | |
| 9,969,819 | B2 | 5/2018 | Palsule et al. | |
| 10,081,685 | B2 | 9/2018 | Stevenson et al. | |
| 10,167,348 | B2 | 1/2019 | Palsule et al. | |
| 10,607,910 | B2 | 3/2020 | Malofsky et al. | |
| 2002/0027294 | A1 | 3/2002 | Neuhaus et al. | |
| 2014/0221532 | A1 | 8/2014 | Wu et al. | |
| 2015/0073110 | A1 | 3/2015 | Malofsky et al. | |
| 2015/0104660 | A1 | 4/2015 | Malofsky et al. | |
| 2015/0210894 | A1 | 7/2015 | Malofsky et al. | |
| 2015/0303122 | A1* | 10/2015 | Malofsky | H01L 24/09 |
| | | | | 257/777 |
| 2015/0361283 | A1 | 12/2015 | Malofsky et al. | |
| 2016/0068621 | A1 | 3/2016 | Sullivan et al. | |
| 2016/0096906 | A1 | 4/2016 | Palsule et al. | |
| 2017/0240657 | A1 | 8/2017 | Palsule et al. | |
| 2017/0253675 | A1 | 9/2017 | Palsule et al. | |
| 2020/0148922 | A1 | 5/2020 | Arai et al. | |
| 2020/0219781 | A1 | 7/2020 | Malofsky et al. | |
| 2020/0283551 | A1 | 9/2020 | Arai et al. | |

FOREIGN PATENT DOCUMENTS

| | | | | |
|---|---|---|---|---|
| JP | 2004504730 | A | 2/2004 | |
| JP | 2007177014 | A | 7/2007 | |
| JP | 2014531505 | A | 11/2014 | |
| JP | 2015512460 | A | 4/2015 | |
| JP | 2015517973 | A | 6/2015 | |
| JP | 2015519416 | A | 7/2015 | |
| JP | 2016506072 | A | 2/2016 | |
| JP | 2017036361 | A | 2/2017 | |
| JP | 2017526791 | A | 9/2017 | |
| JP | 2017527667 | A | 9/2017 | |
| JP | 2017527668 | A | 9/2017 | |
| JP | 2018517809 | A | 7/2018 | |
| WO | 2013059473 | A2 | 4/2013 | |
| WO | 2014078689 | A1 | 5/2014 | |
| WO | 2014085570 | A1 | 6/2014 | |
| WO | WO-2014085570 | A1 * | 6/2014 | ........... H01L 21/563 |
| WO | 2016040261 | A1 | 3/2016 | |
| WO | 2016205605 | A1 | 12/2016 | |
| WO | 2018212330 | A1 | 11/2018 | |
| WO | 2019088102 | A1 | 5/2019 | |
| WO | 2019137853 | A1 | 7/2019 | |

OTHER PUBLICATIONS

International Search Report (ISR) (and English translation thereof) dated Nov. 5, 2019 issued in International Application No. PCT/JP2019/039261.
Related U.S. Appl. No. 17/282,696, First Named Inventor: Ayako Sato; Title: "Resin Composition"; filed Apr. 2, 2021.
Related U.S. Appl. No. 17/283,540, First Named Inventor: Fuminori Arai; Title: "Curing Agent Composition for Curing 2-Methylene-1,3-Dicarbonyl Compound"; filed Apr. 7, 2021.
Written Opinion dated Dec. 24, 2019 issued in International Application No. PCT/JP2019/039628.
Written Opinion dated Nov. 5, 2019 issued in International Application No. PCT/JP2019/039261.
International Search Report (ISR) (and English translation thereof) dated Jan. 15, 2019 issued in International Application No. PCT/JP2018/040337.
Written Opinion dated Jan. 15, 2019 issued in International Application No. PCT/JP2018/040337.
Chinese Office Action (and English language translation thereof) dated Dec. 23, 2020 issued in Chinese Application No. 201880070166.7.
Extended European Search Report (EESR) dated Jun. 21, 2021 issued in European Application No. 18871993.4.
U.S. Appl. No. 16/614,351; First Named Inventor: Fuminori Arai; Title: "Resin Composition"; filed Nov. 15, 2019.

* cited by examiner

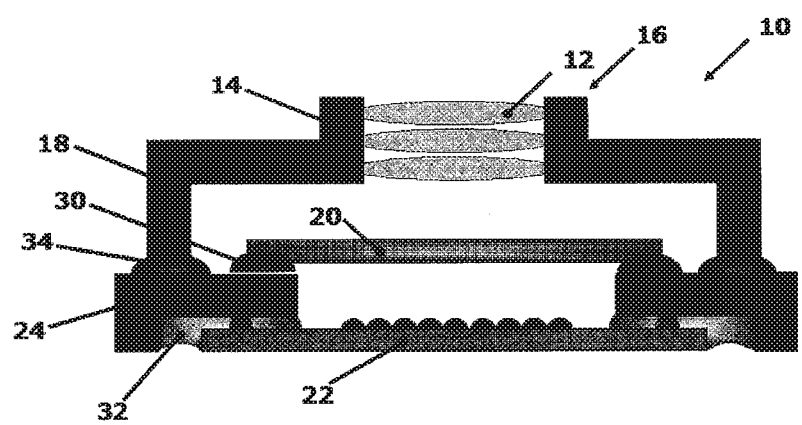

RESIN COMPOSITION

TECHNICAL FIELD

The present invention relates to a resin composition and, in particular, relates to a resin composition suitable for use as an adhesive for electronic components.

BACKGROUND ART

In the manufacture of an image sensor module used as a camera module for a cellular phone or a smart phone, one-part adhesives curable at as low a temperature as possible are used. In the manufacture of electronic components such as semiconductor devices, integrated circuits, large-scale integrated circuits, transistors, thyristors, diodes, capacitors, etc., it is also preferable to use a one-part adhesive that is curable at as low a temperature as possible. There is a need for one-part adhesives that can be cured at even lower temperatures to avoid heat-induced deterioration in the characteristics of neighboring components, as well as to improve manufacturing efficiency.

In addition, another important requirement for a one-part adhesive used in the manufacture of an image sensor module and other electronic components is that the amounts of components that volatilize during use (application) or curing be small.

If an adhesive contains large amounts of components that volatilize during use or curing at normal temperature, particularly when used for electronic components such as a camera/sensor module, the volatilized substances may adhere to sensors, lenses, electrodes, and the like, thereby causing them to be contaminated. In a process for manufacturing a module, typically, cleaning with a solvent is commonly carried out to remove the adhered substance that is generated in the process and causes such contamination. If the adhered substance is in a liquid state, such cleaning can remove the adhered substance relatively easily, but if it is a solid substance that has cured on components, it is difficult to remove it from the components, which raises concern about increased production costs caused by a decrease in yield etc. Also, the generation of bubbles in the cured product due to volatilized substances may lead to a decreased adhesion strength as a result of a decrease in bulk strength or a reduction in the area of the adherend interface. If bubbles are generated at the time of curing, it may compromise reliability through a decrease in the positional accuracy of the adherend due to deformation. Furthermore, if there are large amounts of volatile components, it gives rise to concerns about health effects on workers such as irritation to the eyes, the bronchi, and the like, and may cause a deterioration of the working environment.

Conventionally known one-part adhesives for use in an electronic component such as an image sensor module include thiol-based adhesives comprising an epoxy resin, a multifunctional thiol compound, and a curing accelerator as essential components, and acrylate resin-based adhesives comprising a radical initiator or an anion initiator as an essential component, and some of these adhesives are known to be curable at about 80° C. However, there is a need for one-part adhesives that are curable at even lower temperatures in order to improve manufacturing efficiency.

Patent Document 1 discloses a polymerization system that can be cured in a short time even at low temperatures such as room temperature, comprising a diethyl methylene malonate monomer (DEMM) and a polymerization activator carried in inactive engagement.

PRIOR ART DOCUMENTS

Patent Documents

Patent Document 1: Japanese Translation of PCT International Application Publication No. JP-T-2016-506072

SUMMARY OF THE INVENTION

Problems to be Solved by the Invention

However, the polymerization system of Patent Document 1 has a large amount of components that volatilize during use or curing at room temperature, and there is concern that, particularly when used for an electronic component such as an image sensor module, this may cause problems discussed above such as adhesion to, and contamination of, sensors, lenses, electrodes, and the like, as well as deterioration of the working environment and compromised reliability. Further, in this polymerization system, if a less volatile monomer such as a high molecular weight methylene malonate or the like is used in place of a diethyl methylene malonate monomer, the start of the reaction may be delayed due to steric hindrance, which in some cases makes the polymerization system unsuitable for uses that involve curing in a short time at a low temperature.

It is an object of the present invention to provide a resin composition that is curable at low temperatures around room temperature in a relatively short time (within several hours) and is not prone to produce contamination on the surroundings caused by resin volatilization, and that is suitable as a one-part adhesive for use in the manufacture of an image sensor module or an electronic component, in order to solve the problems of the prior art discussed above.

Solution to the Problems

As a result of intensive research to solve the above-mentioned problems, the present inventors have arrived at the present invention.

That is, the present invention includes, but is not limited to, the following inventions.

(1) A resin composition comprising a 2-methylene-1,3-dicarbonyl compound and an initiator, wherein the 2-methylene-1,3-dicarbonyl compound is a compound comprising a structural unit represented by formula (I) below:

and having a molecular weight of 180 to 10,000; and wherein the initiator comprises a basic substance having a $pK_a$ of 8 or greater.

(2) The resin composition according to preceding item (1), wherein the 2-methylene-1,3-dicarbonyl compound has a molecular weight of 260 to 1,500.

(3) The resin composition according to preceding item (1) or (2), wherein the initiator comprises a basic substance having a $pK_a$ of 9 or greater (4) The resin composition according to any one of preceding items (1) to (3), wherein the basic substance is an amine compound.

(5) The resin composition according to preceding item (4), wherein the amine compound has an amine functional group equivalent weight of less than 180.

(6) The resin composition according to preceding item (4), wherein the amine compound has an amine functional group equivalent weight of less than 140.

(7) The resin composition according to any one of preceding items (4) to (6), wherein the amine compound comprises a secondary or tertiary amino group.

(8) The resin composition according to any one of preceding items (4) to (6), wherein the amine compound comprises a tertiary amino group.

(9) The resin composition according to any one of preceding items (4) to (8), wherein the amine compound is liquid at 80° C.

(10) The resin composition according to any one of preceding items (4) to (8), wherein the amine compound is liquid at 25° C.

(11) The resin composition according to any one of preceding items (1) to (9), wherein the basic substance is comprised in an amount of 0.01 to 30 mol % relative to the 2-methylene-1,3-dicarbonyl compound.

(12) The resin composition according to any one of preceding items (1) to (11), for use in the manufacture of an electronic component.

(13) A method for producing a semiconductor device having an electronic component and a circuit board, the method comprising:
  providing an electronic component and a circuit board;
  applying the resin composition according to any one of preceding items (1) to (12) to the surface of the electronic component or the circuit board; and
  contacting the electronic component and the circuit board.

(14) A method for producing a sealed electronic component, comprising:
  providing an electronic component; and
  sealing the electronic component using the resin composition according to
  any one of preceding items (1) to (12).

(15) A method for producing an electronic component, comprising:
  providing a plurality of members to be incorporated in an electronic component;
  applying the resin composition according to any one of preceding items (1) to (12) to the surface of a member to be incorporated in the electronic component; and
  contacting the member with another member to be incorporated in the electronic component.

(16) A method for producing a member to be incorporated in an electronic component, comprising:
  providing a circuit board comprising an electronic circuit; and
  applying the resin composition according to any one of preceding items (1) to (12) onto the electronic circuit on the circuit board.

Effect of the Invention

The resin composition of the present invention can be cured at low temperatures around room temperature in a relatively short time (within several hours), and is not prone to produce contamination on the surroundings caused by resin volatilization, and therefore is suitable as a one-part adhesive used in the manufacture of an image sensor module or an electronic component. Such characteristics make it possible to improve efficiency in manufacturing electronic components and, at the same time, to reduce contamination of neighboring components during use or curing, thereby maintaining a good working environment, as well as to enhance the reliability of the cured product obtained.

BRIEF DESCRIPTION OF THE DRAWINGS

FIG. 1 is a cross-sectional view of a camera module.

DESCRIPTION OF EMBODIMENTS

Embodiments of the prevent invention are described in detail below.

The resin composition of the present invention comprises a 2-methylene-1,3-dicarbonyl compound and an initiator. Hereinbelow, components contained in the resin composition of the present invention will be described.

[2-Methylene-1,3-dicarbonyl Compound]

The 2-methylene-1,3-dicarbonyl compound of the present invention is a compound comprising a structural unit represented by formula (I) below.

(I)

The 2-methylene-1,3-dicarbonyl compound comprises one or more structural units of formula (I) above. In some embodiments, the 2-methylene-1,3-dicarbonyl compound comprises two or six, preferably two, structural units of formula (I) above.

Since the 2-methylene-1,3-dicarbonyl compound comprises the structural unit of formula (I) above, it is polymerized by Michael addition, typically in the presence of a base catalyst, and therefore can be used as a main component of a one-part adhesive. If the 2-methylene-1,3-dicarbonyl compound comprises two or more structural units of formula (I) above (multifunctional), cross-links are generated during curing, and this is expected to result in improvement in physical properties of the cured product such as enhanced mechanical properties at high temperatures.

The resin composition of the present invention may comprise only one 2-methylene-1,3-dicarbonyl compound, and may comprise two or more 2-methylene-1,3-dicarbonyl compounds. At least one of the 2-methylene-1,3-dicarbonyl compounds contained in the resin composition of the present invention has a molecular weight of 180 to 10,000, more preferably 180 to 5,000, even more preferably 180 to 2,000, even more preferably 200 to 1,500, even more preferably 240 to 1,500, particularly preferably 250 to 1,500, and most preferably 260 to 1,500. If the molecular weight of the 2-methylene-1,3-dicarbonyl compound is less than 180, it results in high volatility, thereby worsening the working environment, and at the same time, easily leads to the generation of adhered substances (solids) on neighboring components due to volatile components. By contrast, if the molecular weight of the 2-methylene-1,3-dicarbonyl compound exceeds 10,000, it results in the resin composition having an excessively high viscosity, which decreases workability and also has other negative effects such as imposing limitations on the amount of fillers that can be added. If the resin composition of the present invention comprises two or more 2-methylene-1,3-dicarbonyl compounds, the amount of the 2-methylene-1,3-dicarbonyl compound(s) having a molecular weight that falls within the ranges above is preferably 80 to 100 mass %, more preferably 85 to 100 mass %, even more preferably 90 to 100 mass %, and most preferably 95 to 100 mass %, relative to the total mass of the 2-methylene-1,3-dicarbonyl compounds.

The 2-methylene-1,3-dicarbonyl compound according to the present invention preferably comprises a multifunctional 2-methylene-1,3-dicarbonyl compound (a multifunctional molecule) for greater heat resistance of the cured product. Multifunctional herein means that the 2-methylene-1,3-dicarbonyl compound comprises two or more structural units of formula (I) above. The number of structural units of formula (I) contained in a 2-methylene-1,3-dicarbonyl compound is referred to as the "number of functional groups" of the 2-methylene-1,3-dicarbonyl compound. Of the 2-methylene-1,3-dicarbonyl compounds, those for which the number of functional groups is one are called "monofunctional"; those for which the number of functional groups is two are called "bifunctional"; and those for which the number of functional groups is three are called "trifunctional."

If the resin composition of the present invention comprises a multifunctional component comprised of a multifunctional molecule, the amount of the multifunctional component (i.e. the amount of those 2-methylene-1,3-dicarbonyl compound(s) comprising two or more structural units of formula (I) above) is, from the perspective of mechanical properties at high temperatures, preferably 1 to 100 mass %, more preferably 5 to 95 mass %, even more preferably 5 to 90 mass %, particularly preferably 10 to 90 mass %, and most preferably 10 to 80 mass %, relative to the total mass of the 2-methylene-1,3-dicarbonyl compounds. If the amount of the multifunctional component is less than 1 mass %, crosslinks are not sufficiently formed during curing, resulting in a cured product exhibiting significantly impaired mechanical properties at high temperatures (at or above its softening point).

If the resin composition of the present invention comprises a multifunctional component, a network-like cross-linked structure is formed in the cured product, with the result that the cured product does not flow and maintains a constant storage modulus even at high temperatures, in particular, at temperatures equal to or higher than its glass transition temperature. The storage modulus of the cured product at high temperatures can be measured, for example, by dynamic mechanical analysis (DMA). Typically, if a cured product having a cross-linked structure formed therein is measured by DMA, a region known as a plateau is observed over a wide temperature range above its glass transition temperature over which changes in storage modulus are relatively small as the temperature changes. The storage modulus in this plateau region is evaluated as a quantity related to crosslink density, i.e., the proportion of the multifunctional component in the resin composition.

The 2-methylene-1,3-dicarbonyl compound according to the present invention, from the perspective of the reactivity of Michael addition, described above, preferably comprises an ester structure, as shown, for example, in formulas (VI) and (V) below.

The resin composition of the present invention may comprise at least one 2-methylene-1,3-dicarbonyl compound comprising two or more structural units represented by formula (I) above.

The ratio by weight of the 2-methylene-1,3-dicarbonyl compound in the resin composition of the present invention to the entire resin composition is 0.05 to 0.999, more preferably 0.15 to 0.999, and even more preferably 0.50 to 0.999. If the ratio by weight of the 2-methylene-1,3-dicarbonyl compound contained in the resin composition of the present invention to the entire resin composition is less than 0.05, the 2-methylene-1,3-dicarbonyl compound may not be able to sufficiently reach the entire resin composition, resulting in uneven curing.

In an embodiment, the 2-methylene-1,3-dicarbonyl compound is represented by formula (II) below:

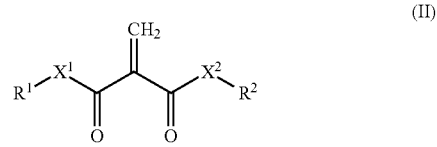

wherein $X^1$ and $X^2$ each, independently, represent a single bond, O or $NR^3$, wherein $R^3$ represents hydrogen or a monovalent hydrocarbon group; and $R^1$ and $R^2$ are each, independently, hydrogen, a monovalent hydrocarbon group, or represented by formula (III) below:

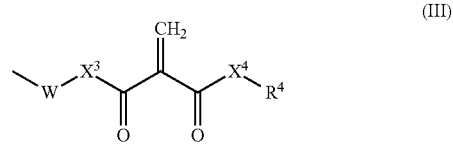

wherein $X^3$ and $X^4$ each, independently, represent a single bond, O or $NR^3$, wherein $R^5$ represents hydrogen or a monovalent hydrocarbon group;

W represents a spacer; and $R^4$ represents hydrogen or a monovalent hydrocarbon group.

In an embodiment, the 2-methylene-1,3-dicarbonyl compound is represented by formula (IV) below:

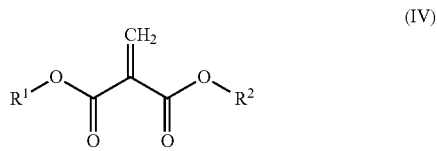

wherein $R^1$ and $R^2$ are each, independently, hydrogen, a monovalent hydrocarbon group, or represented by formula (V) below:

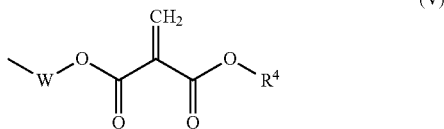

wherein
W represents a spacer; and
$R^4$ represents hydrogen or a monovalent hydrocarbon group.

In another embodiment, the 2-methylene-1,3-dicarbonyl compound is a dicarbonylethylene derivative represented by formula (VI) below:

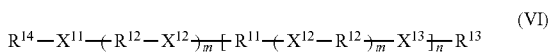

wherein
$R^{11}$ represents a 1,1-dicarbonylethylene unit represented by formula (VII) below:

each $R^{12}$ each, independently, represents a spacer;
$R^{13}$ and $R^{14}$ each, independently, represent hydrogen or a monovalent hydrocarbon group;
$X^{11}$ and each $X^{12}$ and $X^{13}$ each, independently, represent a single bond, O or $NR^{15}$, wherein $R^{15}$ represents hydrogen or a monovalent hydrocarbon group;
each m each, independently, represents 0 or 1; and
n represents an integer of 1 or more and 20 or less;

As used herein, a monovalent hydrocarbon group refers to the group that results if one hydrogen atom is removed from a carbon atom in a hydrocarbon. Examples of the monovalent hydrocarbon group include an alkyl group, an alkenyl group, an alkynyl group, a cycloalkyl group, an alkyl-substituted cycloalkyl group, an aryl group, an aralkyl group, and an alkaryl group, and some of these may comprise heteroatoms such as N, O, S, P and Si.

Each of the monovalent hydrocarbon groups above may be substituted with alkyl, cycloalkyl, heterocyclyl, aryl, heteroaryl, allyl, alkoxy, alkylthio, hydroxyl, nitro, amide, azide, cyano, acyloxy, carboxy, sulfoxy, acryloxy, siloxy, epoxy, or ester. The monovalent hydrocarbon group is preferably an alkyl group, a cycloalkyl group, an aryl group, or an alkyl group substituted with a cycloalkyl group, more preferably, an alkyl group, a cycloalkyl group, or an alkyl group substituted with a cycloalkyl group, and most preferably, an alkyl group.

There are no particular restrictions on the carbon number of the alkyl group, alkenyl group, and alkynyl group (hereinafter collectively referred to as the "alkyl group etc."). The carbon number of the alkyl group is usually 1 to 12, preferably 2 to 10, more preferably 3 to 8, even more preferably 4 to 7, particularly preferably 5 to 6. The carbon number of the alkenyl group and the alkynyl group is usually from 2 to 12, preferably from 2 to 10, more preferably from 3 to 8, even more preferably from 3 to 7, and particularly preferably from 3 to 6. If the alkyl group etc. have a cyclic structure, the number of carbon atoms in the alkyl group etc. is usually 4 to 12, preferably 4 to 10, more preferably 5 to 8, even more preferably 6 to 8.

There are no particular restrictions on the structure of the alkyl group etc. The alkyl group etc. may be linear or may have a side chain. The alkyl group etc. may have a chain structure or a cyclic structure (a cycloalkyl group, a cycloalkenyl group, and a cycloalkynyl group). The alkyl group etc. may have one or more other substituents. For example, the alkyl group etc. may have a substituent comprising an atom other than a carbon atom or a hydrogen atom as a substituent. Also, the alkyl group etc. may comprise one or more atoms other than a carbon atom or a hydrogen atom in a chain structure or a cyclic structure. Examples of the atoms other than a carbon atom or a hydrogen atom above include one or more of an oxygen atom, a nitrogen atom, a sulfur atom, a phosphorus atom, and a silicon atom.

Specific examples of the alkyl group include a methyl group, an ethyl group, an n-propyl group, an i-propyl group, an n-butyl group, an i-butyl group, a sec-butyl group, a t-butyl group, a pentyl group, an isopentyl group, a neopentyl group, a hexyl group, a heptyl group, an octyl group, and a 2-ethylhexyl group. Specific examples of the cycloalkyl group include a cyclopentyl group, a cyclohexyl group, a cycloheptyl group, and a 2-methylcyclohexyl group. Examples of the alkenyl group include a vinyl group, an allyl group, and an isopropenyl group. Specific examples of the cycloalkenyl group include a cyclohexenyl group.

Specific examples of the 2-methylene-1,3-dicarbonyl compound include dibutyl methylene malonate, dipentyl methylene malonate, dihexyl methylene malonate, dicyclohexyl methylene malonate, ethyl octyl methylene malonate, propyl hexyl methylene malonate, 2-ethylhexyl-ethyl methylene malonate, ethylphenyl-ethyl methylene malonate and the like. These are preferable because of their low volatility and high reactivity. From the perspective of handleability, dihexyl methylene malonate and dicyclohexyl methylene malonate are particularly preferable.

As used herein, a spacer refers to a divalent hydrocarbon group, more specifically a cyclic, linear or branched, substituted or unsubstituted alkylene group. There are no particular restrictions on the carbon number of the alkylene group. The carbon number of the alkylene group is usually 1 to 12, preferably 2 to 10, more preferably 3 to 8, and still more preferably 4 to 8. If desired, the alkylene group may comprise a group comprising a heteroatom selected from N, O, S, P, and Si. The alkylene group may have an unsaturated bond. In an embodiment, the spacer is an unsubstituted alkylene group having 4 to 8 carbon atoms. Preferably, the spacer is a linear, substituted or unsubstituted alkylene group, more preferably, an alkylene group having a structure represented by the formula $-(CH_2)_n-$, wherein n is an integer from 2 to 10, preferably from 4 to 8, and wherein the carbon atoms at both ends are bonded to the remaining moieties of the 2-methylene-1,3-dicarbonyl compound.

Specific examples of the divalent hydrocarbon group for the spacer include, but are not limited to, a 1,4-n-butylene group and a 1,4-cyclohexylene dimethylene group.

If the 2-methylene-1,3-dicarbonyl compound has a spacer, the number of carbon atoms in the terminal monovalent hydrocarbon group is preferably 3 or less. That is, if the 2-methylene-1,3-dicarbonyl compound is represented by formula (II) or (IV) above, it is preferable that $R^4$ in formula (III) or (V) above be alkyl having 1 to 3 carbon atoms, but if either one of $R^1$ and $R^2$ is represented by formula (III) or formula (V) above, it is preferable that the other of $R^1$ and $R^2$ be alkyl having 1 to 3 carbon atoms. In this case, in formula (II) or formula (IV) above, both $R^1$ and $R^2$ may be represented by formula (III) or formula (V) above, and preferably, only either one of $R^1$ and $R^2$ is represented by formula (III) or formula (V) above. Preferably, the 2-methylene-1,3-dicarbonyl compound is represented by formula (IV) above.

Particularly preferable compounds include compounds represented by formula (IV) above, wherein either one of $R^1$ and $R^2$ is any one of an ethyl group, an n-hexyl group or a cyclohexyl group, the other one is represented by formula (V) above, W is either a 1,4-n-butylene group or a 1,4-cyclohexylene dimethylene group, and $R^4$ is any one of an ethyl group, an n-hexyl group or a cyclohexyl group. Further, other particularly preferable compounds include compounds represented by formula (IV) above, wherein $R^1$ and $R^2$ are represented by formula (V) above, W is either a 1,4-n-butylene group or a 1,4-cyclohexylene dimethylene group, and $R^4$ is any one of an ethyl group, an n-hexyl group or a cyclohexyl group.

2-Methylene-1,3-dicarbonyl compounds having various molecular weights are available from Sirrus Inc., Ohio, USA, and synthetic methods thereof are disclosed in publications of patent applications such as WO2012/054616, WO2012/054633 and WO2016/040261. If both ends of the structural unit represented by formula (I) above contained in the 2-methylene-1,3-dicarbonyl compound are bonded to oxygen atoms, 2-methylene-1,3-dicarbonyl compounds having a higher molecular weight in which a plurality of structural units represented by formula (I) above are liked via an ester bond and the spacer above can be produced by using methods known in the art such as the transesterification with a diol or a polyol disclosed in Japanese Translation of PCT International Application Publication No. JP-T-2015-518503. A 2-methylene-1,3-dicarbonyl compound thus prepared may comprise a hydroxy group in $R^1$ and $R^2$ in formula (II) or formula (IV) above, $R^4$ in formula (HI) or formula (V) above, and $R^{14}$ and $R^{13}$ in formula (VI) above.

[Initiator]

The resin composition of the present invention comprises an initiator. The initiator is expected to contribute to the polymerization initiation reaction when the resin composition is cured by the Michael addition reaction. The initiator used in the present invention comprises a basic substance.

The basic substance used in the present invention typically comprises an organic base, an inorganic base, or an organometallic material.

Examples of the organic base include amine compounds described below and the like. Examples of the inorganic base include alkali metal hydroxides such as lithium hydroxide, sodium hydroxide, potassium hydroxide and cesium hydroxide; alkaline earth metal hydroxides such as calcium hydroxide; alkali or alkaline earth metal carbonates such as lithium carbonate, potassium carbonate and sodium carbonate; metal hydrogen carbonates such as potassium hydrogen carbonate and sodium hydrogen carbonate; and the like. Examples of organic metal materials include organic alkali metal compounds such as butyllithium, t-butyllithium, phenyllithium, triphenylmethylsodium, and ethylsodium; organic alkaline earth metal compounds such as methyl magnesium bromide, dimethyl magnesium, phenyl magnesium chloride, phenyl calcium bromide, bis(dicyclopentadiene)calcium; and alkoxides such as sodium methoxide and t-butyl methoxide; and carboxides such as sodium benzoate and the like.

When the resin composition of the present invention is used for an electronic material, if the resin composition comprises an inorganic base or an organometallic material, there is concern that this may have unintended impact on electrical characteristics in the electrical or electronic circuit in its vicinity. Therefore, the basic substance used in the present invention preferably does not comprise an alkali metal, an alkaline earth metal, a transition metal, or a halogen. In another embodiment, the basic substance used in the present invention is non-ionic.

The basic substance used in the present invention is preferably an organic base, and more preferably an amine compound. The amine compound is an organic compound having at least one of a primary amino group, a secondary amino group, and a tertiary amino group within the molecule, and may have two or more amino groups of different classes within the same molecule at the same time.

Examples of compounds having a primary amino group include, for example, methylamine, ethylamine, propylamine, butylamine, ethylenediamine, propylenediamine, hexamethylenediamine, diethylenetriamine, triethylenetetramine, ethanolamine, propanolamine, cyclohexylamine, isophorone diamine, aniline, toluidine, diaminodiphenylmethane, diaminodiphenylsulfone and the like.

Examples of compounds having a secondary amino group include, for example, dimethylamine, diethylamine, dipropylamine, dibutylamine, dipentylamine, dihexylamine, dimethanolamine, diethanolamine, dipropanolamine, dicyclohexylamine, piperidine, piperidone, diphenylamine, phenylmethylamine, phenylethylamine and the like.

Examples of compounds having a tertiary amino group include, for example, triethylamine, tributylamine, trihexylamine, triallylamine, 3-diethylaminopropylamine, dibutylaminopropylamine, tetramethylethylenediamine, triethylenediamine, tri-n-octylamine, dimethylaminopropylamine, N,N-dimethylethanolamine, triethanolamine, N,N-diethylethanolamine, N-methyl-N,N-diethanolamine, N,N-dibutylethanolamine, triphenylamine, 4-methyltriphenylamine, 4,4-dimethyltriphenylamine, diphenylethylamine, diphenylbenzylamine, N,N-diphenyl-p-anisidine, 1,1,3,3-tetramethylguanidine, N,N-dicyclohexylmethylamine, diazabicyclooctane, 2,6,10-trimethyl-2,6,10-triazaundecane, l-benzylpiperidine, N,N-dimethylbenzylamine, N-ethyl-N-methylbenzylamine, N,N-diethylbenzylamine and the like.

Examples of compounds having two or more different amino groups at the same time within the same molecule include, but are not limited to, a guanidine compound, used as a raw material in an embodiment of the present invention, an imidazole compound and the like. Examples of the guanidine compound include dicyandiamide, methylguanidine, ethylguanidine, propylguanidine, butylguanidine, dimethylguanidine, trimethylguanidine, phenylguanidine, diphenylguanidine, tolylguanidine, 1,1,3,3-tetramethylguanidine and the like. Examples of the imidazole compound include 2-ethyl-4-methylimidazole, 2-methylimidazole, 2-heptadecylimidazole, 2-phenyl-4,5-dihydroxymethylimidazole, 2-undecylimidazole, 2-phenyl-4-methyl-5-hydroxymethylimidazole, 2-phenyl-4-benzyl-5-hydroxymethylimidazole, 2,4-diamino-6-(2-methylimidazolyl-(1))-ethyl-s-triazine, 2,4-diamino-6-(2'-methylimidazolyl-(1)-ethyl-s-triazine/isocyanuric acid adduct, 2-methylimidazole, 2-phenylimidazole, 2-phenyl-4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)-urea, and N,N'-(2-methylimidazolyl-(1)-ethyl)-adipoyldiamide. However, the imidazole compound is not limited to these compounds.

The amine compound above preferably comprises a secondary or tertiary amino group. If the amino group contained in the amine compound is primary, there is an increased likelihood that activated hydrogen generated from the amino group suppresses the polymerization reaction. The amine compound above more preferably comprises a tertiary amino group.

The amine compound above preferably does not comprise an alkali metal, an alkaline earth metal, a transition metal or a halogen.

The amine compound above preferably does not comprise an alcoholic hydroxyl group.

In the present invention, if the basic substance is in solid form when the resin composition is cured, the reaction proceeds on the surface of the basic substance, and the reaction does not extend throughout the entire resin composition, resulting in uneven curing. For this reason, the basic substance is preferably liquid at 80° C., and more preferably liquid at 25° C.

In general, the basicity of a basic substance can be evaluated (measured) by the acid dissociation exponent $pK_a$, or $-\log K_a$, which is the common logarithm of the reciprocal of $K_a$, which is the acid dissociation constant between the basic substance in neutral form and its conjugate acid. The $pK_a$ of the conjugate acid of a basic substance or a basic group may simply be referred to herein as the $pK_a$ of the basic substance or the basic group.

The $pK_a$ of the basic substance used in the present invention is preferably 8 or greater, more preferably 9 or greater, even more preferably 10 or greater, and most preferably 11 or greater. The resin composition of the present invention comprises a 2-methylene-1,3-dicarbonyl compound having a molecular weight of 180 or greater, and if the $pK_a$ of the basic substance is less than 8, the resin composition does not cure within a predetermined time. This is believed to be attributable to the large steric hindrance in the vicinity of the functional groups stemming from the fact that the resin composition of the present invention comprises a 2-methylene-1,3-dicarbonyl compound having a molecular weight of 180 or greater, with the result that a basic substance having a $pK_a$ of less than a certain value is not able to readily initiate the polymerization reaction.

The acid dissociation exponent ($pK_a$) between a basic substance in neutral form and its conjugate acid, described above, can be determined as appropriate by methods known to those skilled in the art such as an electrochemical method and a spectroscopic method. As used herein, unless otherwise specified, "$pK_a$" refers to the value of $pK_a$ estimated using the software MarvinSketch 17.22.0, developed by ChemAxon, on the basis of the chemical structure and selecting water as the solvent, with the following settings: Temperature: 298 K, Mode: macro, Acid/base prefix: static. However, if the basic substance of interest has a plurality of basic sites such as amino groups within the single molecule, the largest $pK_a$ value is employed as the $pK_a$ of the basic substance. If a plurality of basic sites exhibiting the largest $pK_a$ exist at equivalent positions in the structure of the molecule, the number of these equivalent basic sites exhibiting the largest $pK_a$ is defined as N.

The amine functional group equivalent weight of the amine compound above is preferably less than 180, more preferably less than 170, even more preferably less than 140, particularly preferably less than 120. An amine functional group equivalent weight of less than 180 results in high curability, and an amine functional group equivalent weight of less than 140 results in even higher curability. As used herein, "amine functional group equivalent weight" is the value obtained by dividing the molecular weight of one molecule of an amine compound by N, which is the number of the amino groups that are contained in the amine compound and whose conjugate acids have the largest $pK_a$. For example, DABCO, described below, has two amino groups within the molecule, and these amino groups are structurally equivalent, which means, for DABCO, N=2. Also, TMTAU, described below, has three amino groups within the molecule, and, among these three amino groups, the amino groups showing the largest $pK_a$ are the tertiary amino groups at both ends, and these two amino groups are structurally equivalent, which means, for TMTAU, N=2. In the case of TMG, described below, there are three amino groups within the molecule, and among these, the amino group exhibiting the largest $pK_a$ is the secondary amino group, and it follows that N=1. Further, BDMAPA, described below, has three amino groups within the molecule, and among these three amino groups, the amino groups exhibiting the largest $pK_a$ are the tertiary amino groups at both ends, and these two amino groups are structurally equivalent, which means, for BDMAPA, N=2.

The molecular weight of the amine compound above is preferably from 100 to 1,000, more preferably from 100 to 500, and even more preferably from 110 to 300. If the molecular weight of the amine compound is less than 100, its volatility is high, giving rise to concern that, among other things, this may affect neighboring components and cause the cured product to have unstable physical properties. If the molecular weight of the amine compound exceeds 1,000, this may lead to, among other things, an increase in the viscosity of the amine compound and a decrease in the dispersibility of the amine compound in the resin composition.

The initiator of the present invention may be used alone or in combination of two or more types.

The initiator of the present invention may be such that that it has been rendered inactivated by separation or latentization and can be activated by any stimulus such as heat, light, mechanical shear, or the like. More specifically, the initiator may be a latent curing catalyst such as a microcapsule, or those based on ion dissociation or an inclusion compound, and may be in a form that generates a base on exposure to heat, light, electromagnetic waves, ultrasonic waves, or physical shear. Further, the resin composition of the present invention can be used as a two-part adhesive.

In the present invention, the amount of the basic substance is preferably 0.01 mol % to 30 mol %, and more preferably, 0.01 mol % to 10 mol %, based on the total amount (100 mol %) of the 2-methylene-1,3-dicarbonyl compound in the resin composition. If the amount of the basic substance is less than 0.01 mol %, it results in unstable curing. Conversely, if the amount of the basic substance is more than 30 mol %, a large amount of the basic substance that is not chemically bonded with the resin matrix remains in the cured product, causing, among other things, deterioration in physical properties of the cured product and bleeding.

The resin composition of the present invention may comprise, if necessary, the following components in addition to the 2-methylene-1,3-dicarbonyl compound above and the initiator above.

[Component (A): Inorganic Filler]

The resin composition of the present invention may comprise an inorganic filler as component (A). Examples of the inorganic filler of component (A) include silica fillers such as colloidal silica, hydrophobic silica, fine silica, and nanosilica; metal oxides such as calcium carbonate, alumina, and zinc oxide; metals such as nickel, copper, and silver; acrylic beads, glass beads, urethane beads, bentonite, acetylene black, Ketjen black, and the like. Among these, silica filler is preferable because it is conducive to high filler content. The inorganic filler of component (A) may be subjected to surface treatment with a silane coupling agent or the like. A filler that has been subjected to surface treatment is expected to have an effect of preventing filler aggregation. The inorganic filler of component (A) may be used alone or in combination of two or more types.

In addition, the average particle diameter (the average maximum diameter, if not granular) of the inorganic filler of component (A) is preferably, but is not limited to, 0.01 to 50 µm for ease of dispersing the filler uniformly in the resin composition, and for other reasons such as excellent injectability for when the resin composition is used as an adhesive or a liquid sealing material such as an underfill. If the average particle diameter is less than 0.01 µm, it may increase the viscosity of the resin composition, thereby reducing injectability when the resin composition is used as an adhesive or a liquid sealing material such as an underfill. If the average particle diameter exceeds 50 µm, it may be difficult to disperse the filler uniformly in the resin composition. In addition, it is more preferable that the average particle diameter of component (A) is 0.6 to 10 µm for the purpose of protecting copper wire from the thermal stress of the cured resin composition. Commercial products include high-purity synthetic spherical silicas manufactured by Admatechs (product name: SE5200SEE, average particle diameter: 2 µm; product name: SO-E5, average particle diameter: 2 µm; product name: SO-E2, average particle diameter: 0.6 µm), a silica manufactured by Tatsumori (product name: FB7SDX, average particle diameter: 10 µm), a silica manufactured by Micron (product name: TS-10-034P, average particle diameter: 20 µm), and the like. The average particle diameter of the inorganic filler is measured by a Nanotrac dynamic light scattering particle size analyzer.

The inorganic filler of component (A) may be electrically insulative or conductive. If the inorganic filler is electrically insulative, the amount of the inorganic filler of component (A) is preferably 0 to 95 parts by weight, more preferably 0 to 85 parts by weight, and more preferably 0 to 50 parts by weight, based on 100 parts by weight in total of all the components of the resin composition. If the amount is 0 to 50 parts by weight, it allows deterioration in injectability to be prevented when the resin composition is used as a liquid sealing material such as an underfill. If the amount is 10 to 95 parts by weight, it allows the coefficient of linear expansion of the resin composition to be reduced. If the inorganic filler is electrically conductive, the amount of the inorganic filler of component (A) is preferably from 50 to 95 parts by weight from the perspective of electrical conductivity, so that the resin composition can be used as an electrically conductive paste.

[Component (B): Stabilizer]

The resin composition of the present invention may comprise a (B) stabilizer.

The (B) stabilizer is for enhancing the stability of the resin composition during storage, and is added to suppress the occurrence of unintended polymerization reactions due to radicals or basic components. The 2-methylene-1,3-dicarbonyl compound may generate radicals by itself with a low probability, and these radicals may act as a starting point to trigger an unintended radical polymerization reaction. Also, the 2-methylene-1,3-dicarbonyl compound may undergo anionic polymerization reactions due to the presence of very small amounts of basic impurities. The occurrence of such unintended polymerization reactions due to radicals or basic impurities can be suppressed by adding a (B) stabilizer.

Stabilizers known in the art can be used for the (B) stabilizer, and for example, a strong acid or a radical scavenger can be used. Specific examples of the (B) stabilizer include trifluoromethanesulfonic acid, maleic acid, methanesulfonic acid, difluoroacetic acid, trichloroacetic acid, phosphoric acid, dichloroacetic acid, N-nitroso-N-phenylhydroxylamine aluminum, triphenylphosphine, 4-methoxyphenol, and hydroquinone. Among these, preferable (B) stabilizers are at least one selected from maleic acid, methanesulfonic acid, N-nitroso-N-phenylhydroxylamine aluminum and 4-methoxyphenol. Stabilizers known in the art such as those disclosed in JP 2010-117545 A and JP 2008-184514 A can also be used for the (B) stabilizer.

The (B) stabilizer may be used alone or in combination of two or more types.

[Component (C): Interface Treatment Agent]

The resin composition of the present invention may comprise an (C) interface treatment agent.

There are no particular limitations on the (C) interface treatment agent, but typically, a coupling agent can be used. A coupling agent has two or more different functional groups within the molecule, one of which is a functional group that chemically bonds to an inorganic material and the other of which is a functional group that chemically bonds to an organic material. If an adhesive comprises a coupling agent, the adhesion of the adhesive to a circuit board or the like is improved.

Examples of coupling agents include, but are not limited to, silane coupling agents, aluminum coupling agents, titanium coupling agents and the like. One type of coupling agent may be used, or two or more types may be used in combination.

Examples of functional groups possessed by silane coupling agents include a vinyl group, an epoxy group, a styryl group, a methacrylic group, an acrylic group, an amino group, an isocyanurate group, a ureide group, a mercapto group, a sulfide group, an isocyanate group, and the like.

[Component (D): Pigment]

The resin composition of the present invention may comprise a (D) pigment.

The chromaticity of the resin composition of the present invention can be adjusted by incorporation of a (D) pigment. Examples of (D) pigments that can be used include, but are not limited to, carbon black, titanium black such as titanium nitride, a black organic pigment, a mixed color organic pigment, an inorganic pigment and the like. Examples of the black organic pigment include perylene black, aniline black, and the like; examples of the mixed color organic pigment include those obtained by mixing at least two kinds of pigments selected from red, blue, green, purple, yellow, magenta, cyan, and the like to obtain a pseudo-black color; and examples of the inorganic pigment include graphite, fine metal particles of titanium, copper, iron, manganese, cobalt, chromium, nickel, zinc, calcium, silver, and the like, metal oxides, complex oxides, metal sulfides, metal nitrides, and the like. These may be used alone or as a mixture of two or more types. The (D) pigment is preferably carbon black or titanium black.

[Component (E): Plasticizer]

The resin composition of the present invention may comprise an (E) plasticizer.

For the (E) plasticizer, any plasticizer known in the art can be combined. The (E) plasticizer can improve formability or adjust glass transition temperature. For the (E) plasticizer, plasticizers having good compatibility and that do not easily bleed can be used.

Examples of (E) plasticizers are phthalic acid esters such as di-n-butyl phthalate, di-n-octyl phthalate, bis(2-ethylhexyl) phthalate, di-n-decyl phthalate, and diisodecyl phthalate; adipic acid esters such as bis(2-ethylhexyl) adipate and di-n-octyl adipate; sebacic acid esters such as bis(2-ethylhexyl) sebacate, and di-n-butyl sebacate; azelaic acid esters such as bis(2-ethylhexyl) azelate; paraffins such as chlorinated paraffins; glycols such as polypropylene glycol; epoxy-modified vegetable oils such as epoxidized soybean oil and epoxidized linseed oil; phosphate esters such as trioctyl phosphate and triphenyl phosphate; phosphite esters such as triphenyl phosphite; ester oligomers such as esterified products of adipic acid and 1,3-butylene glycol; low molecular weight polymers such as low molecular weight polybutene, low molecular weight polyisobutylene and low molecular weight polyisoprene; oils such as process oils and naphthenic oils; and the like.

The (E) plasticizer may be used alone or in combination of two or more types.

The resin composition of the present invention may comprise components (A) to (E), if necessary, in addition to the 2-methylene-1,3-dicarbonyl compound above and the initiator above. The resin composition of the present invention can be prepared by mixing these components. Apparatuses known in the art can be used for mixing. For example, mixing can be performed by apparatuses known in the art such as a Henschel mixer or a roll mill. These ingredients may be mixed simultaneously, or it may be such that some are mixed first, and the remainder are mixed later.

[Vapor Pressure]

The 2-methylene-1,3-dicarbonyl compound contained in the resin composition of the present invention has a vapor pressure at 25° C. of preferably 0.05 mmHg or lower, more preferably 0.01 mmHg or lower, and particularly preferably 0.001 mmHg or lower.

In the present invention, the vapor pressure of a compound such as the 2-methylene-1,3-dicarbonyl compound can be based on the value registered on the database of, or the value estimated by the Y-MB method of, the commercially available software HSPiP (4th Edition 4.1.05).

In the present invention, the vapor pressure of an amine compound can also be estimated by the same method. The amine compound contained in the resin composition of the present invention has a vapor pressure at 25° C. of preferably 100 mmHg or lower, more preferably 10 mmHg or lower, and particularly preferably 1 mmHg or lower.

The resin composition of the present invention may comprise components other than the 2-methylene-1,3-dicarbonyl compound or (A) to (E) above, such as, for example, a flame retardant, an ion trapper, an antifoaming agent, a leveling agent, a foam breaker, etc. as long as they do not impair the effectiveness of the present invention. In addition, if the resin composition of the present invention comprises an organic solvent that does not contribute to curing (i.e., that is not incorporated into the polymerization system) such as toluene, benzene, chloroform, etc., not only is there concern for environmental problems, but also for the generation of voids in the cured product. For this reason, the resin composition of the present invention preferably does not substantially comprise an organic solvent. That is, the resin composition of the present invention is preferably in a solventless form.

The present invention also provides the resin composition of the present invention used in the manufacture of electronic components. Typically, the resin composition of the present invention can be used as an adhesive or a sealing material. That is, the resin composition of the present invention is suitable for adhesion and sealing for electronic components. More specifically, the resin composition of the present invention can be used for adhesion and sealing of components for camera modules, and is particularly suitable for adhesion of image sensor modules. This is because the resin composition of the present invention only has a very small amount of volatile components that contaminate the surroundings, and it, therefore, is not prone to the generation of adhered substances (solids). The resin composition of the present invention is preferably in one-part form (a one-part liquid resin composition). That is, the present invention also provides use of the resin composition of the present invention as a one-part adhesive. Preferable embodiments of the one-part adhesive are the same as those of use as an adhesive described above. Further, the resin composition of the present invention is preferably in a solventless form.

As shown in FIG. 1, the resin composition of the present invention, for example, can be used to adhere an IR cut filter 20 to a printed circuit board 24. The resin composition of the present invention can be used to adhere an image sensor 22 to the printed circuit board 24. The resin composition of the present invention can be used to adhere a support 18 to the printed circuit board 24. A jet dispenser, an air dispenser, or the like can be used to supply the resin composition to the adherend surface. The resin composition of the present invention can be cured at normal temperature without heating. The resin composition of the present invention can also be cured by heating at a temperature of 25 to 80° C., for example. The heating temperature is preferably 50 to 80° C. The heating time is, for example, 0.5 to 4 hours.

The resin composition of the present invention can also be used for an image sensor module other than a camera module. For example, it can be used for adhesion and sealing of components of an image sensor module that may be incorporated in a fingerprint authentication device, a face authentication device, a scanner, a medical device, or the like. The resin composition of the present invention is preferably in one-part form (a one-part liquid resin composition). Further, the resin composition of the present invention is preferably in a solventless form.

The resin composition of the present invention can also be used as a constituent material of a film or a prepreg. In particular, the resin composition of the present invention is suitable as a constituent material of a coverlay film for protecting wiring patterns, an interlayer adhesive film for a multilayer wiring substrate, and a prepreg. This is because the resin composition of the present invention only has a very small amount of volatile components, and it, therefore, is not prone to the generation of voids. The film or prepreg comprising the resin composition of the present invention, preferably, can be used for electronic components.

The prepreg comprising the resin composition of the present invention can be produced by methods known in the art such as, for example, a hot melt method or a solvent method. When a hot melt method is used, a prepreg can be produced without dissolving the resin composition of the present invention in an organic solvent, for example, first by temporarily applying a coating of the resin composition of the present invention onto a release paper having good releasability against the resin composition and then laminating it on a sheet of fiber substrate, or by directly applying a coating using a die coater. When a solvent method is used, a sheet of fiber substrate is first immersed in a resin composition varnish prepared by dissolving the resin composition of the present invention in an organic solvent, thereby impregnating the resin composition varnish into the sheet of fiber substrate, and then the sheet of fiber substrate is dried to obtain a prepreg.

The film comprising the resin composition of the present invention can be obtained from the resin composition of the present invention by methods known in the art. For example, the resin composition of the present invention can be diluted with a solvent to form a varnish, which is applied to at least one side of a support, dried, and then provided as a film with a support or as a film detached from the support.

The present invention also provides a cured product obtained by curing the resin composition of the present invention. The present invention also provides a cured product obtained by curing an adhesive or a sealing material comprising the resin composition of the present invention, and a cured product obtained by curing a film or a prepreg comprising the resin composition of the present invention.

Furthermore, the present invention also provides a semiconductor device comprising the cured product of the present invention, the cured product of the adhesive or the sealing material of the present invention, or the cured product of the film or the prepreg of the present invention.

The present invention also provides a method for adhering members to be incorporated in an electronic component, the method comprising applying the resin composition of the present invention to a member to be incorporated in an electronic component and adhering it to another member to be incorporated in the electronic component. The electronic component is preferably a component for a camera module, more preferably an image sensor module. Also provided is a method for adhering or sealing an electronic component or a semiconductor element on a circuit board, the method comprising applying or injecting the resin composition of the present invention. Further provided is a method for sealing an electronic circuit, the method comprising applying the resin composition of the present invention onto an electronic circuit formed on a circuit board.

The present invention also provides a method for producing an electronic component, the method comprising: providing a plurality of members to be incorporated in an electronic component; applying the resin composition of the present invention to the surface of a member to be incorporated in the electronic component; and contacting the member with another member to be incorporated in the electronic component. The above-mentioned method for producing an electronic component may further comprise heating and curing the resin composition at a temperature of 25 to 80° C. for 0.5 to 4 hours after contacting the members.

The present invention also provides a method for producing a member to be incorporated in an electronic component, the method comprising providing a circuit board comprising an electronic circuit and applying the resin composition of the present invention onto the electronic circuit on the circuit board. The above-mentioned method for producing a member to be incorporated in an electronic component may further comprise heating and curing the resin composition at a temperature of 25 to 80° C. for 0.5 to 4 hours after applying the resin composition. The above-mentioned method for manufacturing a member to be incorporated in an electronic component may further comprise heating and curing the resin composition at a temperature of 25 to 80° C. for 0.5 to 4 hours to seal the electronic circuit, after applying the resin composition.

Preferable embodiments of the method for producing an electronic component and the method for producing a member to be incorporated in an electronic component mentioned above are the same as for when, as described above, the resin composition of the present invention is used as an adhesive. In these methods, the electronic component is preferably a component for a camera module, more preferably an image sensor module.

The present invention also further provides a method for adhering an electronic component to a circuit board comprising: (1) providing an electronic component and a circuit board; (2) applying the resin composition of the present invention to the surface of the electronic component or the circuit board; and (3) contacting the electronic component and the circuit board.

The present invention also provides a method for producing a semiconductor device comprising: (1) providing an electronic component and a circuit board; (2) applying the resin composition of the present invention to the surface of the electronic component or the circuit board; and (3) contacting the electronic component and the circuit board. The above-mentioned method for producing a semiconductor device may further comprise heating and curing the resin composition at a temperature of 25 to 80° C. for 0.5 to 4 hours after contacting the electronic component and the circuit board.

Preferable embodiments of the method for adhering an electronic component to a circuit board and the method for producing a semiconductor device mentioned above are the same as for when, as described above, the resin composition of the present invention is used as an adhesive.

The present invention also provides a method for sealing an electronic component comprising: (1) providing an electronic component; and (2) sealing the electronic component using the resin composition of the present invention.

The present invention further provides a method for producing a sealed electronic component, comprising: (1) providing an electronic component; and (2) sealing the electronic component using the resin composition of the present invention. The above-mentioned method for producing a sealed electronic component may further comprise heating and curing the resin composition at a temperature of 25 to 80° C. for 0.5 to 4 hours after sealing the electronic component.

Preferable embodiments of the method for sealing an electronic component and the method for producing a sealed electronic component mentioned above are the same as for when, as described above, the resin composition of the present invention is used as a sealing material.

EXAMPLES

Examples and comparative examples of the present invention will be described below. The present invention is not limited to the following Examples and Comparative Examples. In the following Examples and Comparative Examples, the proportions of the components contained in adhesives are given in parts by weight.

[Estimating Vapor Pressures]

Vapor pressures at various temperatures were estimated for several embodiments of the 2-methylene-1,3-dicarbonyl compound used in the present invention, using HSPiP (4th Edition 4.1.05, Y-MB method). Table 1 shows the vapor pressures (unit: mmHg) at various temperatures for dimethyl methylene malonate (DMMM), diethyl methylene malonate (DEMM), ethyl propyl methylene malonate (EPMM), dipropyl methylene malonate (DPMM), ethylphenyl-ethyl methylene malonate (EPEMM), 2-ethylhexyl-ethyl methylene malonate (2EHEMM), ethyl octyl methylene malonate (EOMM), dihexyl methylene malonate (DHMM), and dicyclohexyl methylene malonate (DCHMM).

TABLE 1

| Sample | Molecular weight | Temperature [° C.] | | | | | |
|---|---|---|---|---|---|---|---|
| | | 25 | 50 | 80 | 100 | 120 | 150 |
| DMMM | 144.1 | 0.3587 | 2.3814 | 14.3900 | 38.6500 | 91.1600 | 272.4000 |
| DEMM | 172.2 | 0.0899 | 0.7313 | 5.3007 | 15.6700 | 40.0500 | 132.2000 |
| EPMM | 186.2 | 0.0380 | 0.3542 | 2.8763 | 9.0163 | 24.2100 | 84.8000 |
| DPMM | 200.2 | 0.0170 | 0.1757 | 1.5970 | 5.3054 | 14.9500 | 55.5300 |
| EPEMM | 248.3 | 0.0000 | 0.0003 | 0.0074 | 0.0448 | 0.2057 | 1.3710 |
| 2EHEMM | 256.3 | 0.0003 | 0.0053 | 0.0874 | 0.3919 | 1.4159 | 7.1051 |
| EOMM | 256.3 | 0.0001 | 0.0022 | 0.0430 | 0.2128 | 0.8324 | 4.5881 |
| DHMM | 284.4 | 0.0000 | 0.0003 | 0.0077 | 0.0463 | 0.2116 | 1.4038 |
| DCHMM | 280.4 | 0.0000 | 0.0001 | 0.0019 | 0.0120 | 0.0587 | 0.4234 |

Table 1 shows that 2-methylene-1,3-dicarbonyl compounds having a molecular weight of 180 or greater have low vapor pressures, in particular, vapor pressures of approximately 0.05 mmHg or lower at 25° C. Little volatilization occurs when a 2-methylene-1,3-dicarbonyl compound having a vapor pressure of 0.05 mmHg or lower at 25° C. is cured at room temperature, causing little contamination of neighboring components.

Vapor pressures were similarly estimated for several of embodiments of the amine compound used in the present invention. Table 2 shows the vapor pressures (unit: mmHg) at various temperatures for trimethylamine (TMA), diethylmethylamine (DEMA), triethylamine (TEA), diazabicyclooctane (DABCO), 1,1,3,3-tetramethylguanidine (TMG), N,N-dimethylbenzylamine (DMBA), N,N,2,4,6-pentamethylaniline (PMAN), 1-benzylpiperidine (BPDi), 1-benzyl-4-piperidone (BPDo), N,N-dicyclohexylmethylamine (DCHMA), 2,6,10-trimethyl-2,6,10-triazaundecane (TMTAU) and bis(4-dimethylaminophenyl)amine (BDMAPA).

Table 2 shows that amine compounds having a molecular weight of less than 100 have remarkably high vapor pressures, and in particular, their vapor pressures at 25° C. exceed 100 mmHg for the most part.

[Preparing Adhesives]

The raw materials for the adhesives used in the following Examples and Comparative Examples are as follows.

2-Methylene-1,3-dicarbonyl compounds:

EPEMM (manufactured by Sirrus Inc.)

2EHEMM (manufactured by Sirrus Inc.)

EOMM (manufactured by Sirrus Inc.)

DHMM (manufactured by Sirrus Inc.)

DCHMM (manufactured by Sirrus Inc.)

The specific structural formulas for the 2-methylene-1,3-dicarbonyl compounds listed above are shown in Table 3 below.

TABLE 2

| Sample | Molecular weight | Temperature [° C.] | | | | | |
|---|---|---|---|---|---|---|---|
| | | 25 | 50 | 80 | 100 | 120 | 150 |
| TMA | 59.1 | 1171.2000 | 2537.5000 | 5460.3000 | 8434.7000 | 12408.2000 | 20539.5000 |
| DEMA | 87.2 | 148.7000 | 407.3000 | 1096.6000 | 1916.6000 | 3139.1000 | 5959.9000 |
| TEA | 101.2 | 58.8200 | 180.1000 | 538.8000 | 997.5000 | 1717.0000 | 3741.9000 |
| DABCO | 112.2 | 1.7934 | 8.0127 | 34.2700 | 77.1300 | 157.3000 | 394.4000 |
| TMG | 115.2 | 0.0118 | 0.1512 | 1.5754 | 5.5298 | 16.1700 | 62.0600 |
| DMBA | 135.2 | 0.7275 | 3.8453 | 19.1200 | 46.5700 | 101.4000 | 275.9000 |
| PMAN | 163.3 | 0.0320 | 0.2641 | 1.9670 | 5.9337 | 15.4900 | 52.7200 |
| BPDi | 175.3 | 0.0064 | 0.0628 | 0.5470 | 1.7935 | 5.0259 | 18.6900 |
| BPDo | 189.3 | 0.0003 | 0.0055 | 0.0756 | 0.3141 | 1.0717 | 5.0623 |
| DCHMA | 195.3 | 0.0202 | 0.1609 | 1.1668 | 3.4794 | 9.0085 | 30.4200 |
| TMTAU | 201.4 | 0.0303 | 0.2547 | 1.9244 | 5.8466 | 15.3500 | 52.5900 |
| BDMAPA | 255.4 | 0.0000 | 0.0000 | 0.0000 | 0.0001 | 0.0010 | 0.0185 |

TABLE 3

| | | |
|---|---|---|
| DEMM | Diethyl methylene malonate | 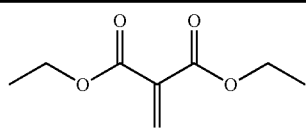 |
| EPEMM | Ethylphenyl-ethyl methylene malonate | 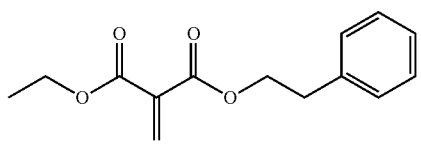 [SMILES: C=C(C(=O)OCC)C(=O)OCCc1ccccc1] |
| 2EHEMM | 2-Ethylhexyl-ethyl methylene malonate | 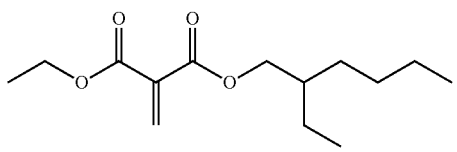 [SMILES: C=C(C(=O)OCC)C(=O)OCC(CC)CCCC] |
| EOMM | Ethyl octyl methylene malonate | 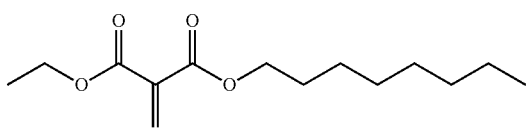 [SMILES: C=C(C(=O)OCC)C(=O)OCCCCCCCC] |
| DCHMM | Dicyclohexyl methylene malonate | 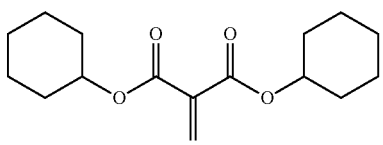 [SMILES: C=C(C(=O)OC1CCCCC1)C(=O)OC1CCCCC1] |
| DHMM | Dihexyl methylene malonate | 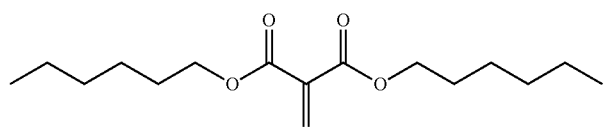 [SMILES: C=C(C(=O)OCCCCCC)C(=O)OCCCCCC] |

Initiators:

TMG 1,1,3,3-tetramethylguanidine (Wako Pure Chemical Industries, Ltd.)

DCHMA N,N-dicyclohexylmethylamine (Tokyo Chemical Industry Co., Ltd.)

TEA triethylamine (Wako Pure Chemical Industries, Ltd.)

DABCO diazabicyclooctane (Wako Pure Chemical Industries, Ltd.)

TMTAU 2,6,10-trimethyl-2,6,10-triazaundecane (Tokyo Chemical Industry Co., Ltd.)

BPDi 1-benzylpiperidine (Wako Pure Chemical Industries, Ltd.)

DMBA N,N-dimethylbenzylamine (Wako Pure Chemical Industries, Ltd.)

BPDo 1-benzyl-4-piperidone (Wako Pure Chemical Industries, Ltd.)

BDMAPA bis(4-dimethylaminophenyl)amine (Tokyo Chemical Industry Co., Ltd.)

PMAN N,N,2,4,6-pentamethylaniline (Tokyo Chemical Industry Co., Ltd.)

The 2-methylene-1,3-dicarbonyl compounds and the initiators listed above were weighed into a screw tube bottle made of borosilicate glass in the amounts (unit: g) shown in Tables 4 and 5. After shaking the mixture vigorously for 3 minutes, the gel time of each formulation at room temperature (25° C.) was measured using an automated curing time measuring device MADOKA (model number: MDK4G-02SP), manufactured by Cyber Co., Ltd. and a stirring rod (model number: 3JC-5060 W), under the conditions of a sample volume of 0.3 ml, a rotation of 120 rpm, a revolution of 50 rpm, and a gap of 0.3 mm to evaluate the curing characteristics. Tables 4 and 5 also show the gel time measured for each of the Examples and Comparative Examples, which is the time elapsed from the start of the measurement with the automated gel time measuring device, after the step of vigorous shaking for 3 minutes described above, to the detection of 10% torque.

TABLE 4

| | Molecular weight of R1 + R2 | Molecular weight | N | Amine functional group equivalent weight | Largest $pK_a$ | Example 1 | Example 2 | Example 3 | Example 4 |
|---|---|---|---|---|---|---|---|---|---|
| EPEMM | 166.22 | 248.27 | | | 2.85 | | | | |
| 2EHEMM | 174.28 | 256.34 | | | | 2.86 | | | |

TABLE 4-continued

| | | | | | | | | | |
|---|---|---|---|---|---|---|---|---|---|
| EOMM | 174.28 | 256.34 | | | | | | 2.86 | |
| DCHMM | 198.30 | 280.36 | | | | | | | 2.87 |
| DHMM | 202.33 | 284.39 | | | | | | | |
| TMG | | 115.18 | 1 | 115.18 | 13.4 | 0.15 | 0.14 | 0.14 | 0.13 |
| DCHMA | | 195.34 | 1 | 195.34 | 11.2 | | | | |
| TEA | | 101.19 | 1 | 101.19 | 10.2 | | | | |
| DABCO | | 112.17 | 2 | 56.09 | 9.8 | | | | |
| TMTAU | | 201.36 | 2 | 100.68 | 9.5 | | | | |
| BPDi | | 175.28 | 1 | 175.28 | 9.4 | | | | |
| DMBA | | 135.21 | 1 | 135.21 | 8.9 | | | | |
| BPDo | | 189.26 | 1 | 189.26 | 6.8 | | | | |
| BDMAPA | | 255.36 | 2 | 127.68 | 6.5 | | | | |
| PMAN | | 163.26 | 1 | 163.26 | 5.8 | | | | |
| Amount of amine compound added [mol %] | | | | | | 10 | 10 | 10 | 10 |
| Gel time @ 25° C. [minute] | | | | | | 0 | 0 | 0 | 0 |

| | Example 5 | Example 6 | Example 7 | Example 8 | Example 9 | Example 10 | Example 11 | Comparative Example 1 |
|---|---|---|---|---|---|---|---|---|
| EPEMM | | | | 2.87 | 2.86 | 2.75 | 2.78 | 2.77 |
| 2EHEMM | | | | | | | | |
| EOMM | | | | | | | | |
| DCHMM | | 1.42 | | | | | | |
| DHMM | 2.87 | 1.45 | 2.99 | | | | | |
| TMG | 0.13 | 0.13 | 0.01 | | | | | |
| DCHMA | | | | | | | | |
| TEA | | | | 0.13 | | | | |
| DABCO | | | | | 0.14 | | | |
| TMTAU | | | | | | 0.25 | | |
| BPDi | | | | | | | 0.22 | |
| DMBA | | | | | | | | |
| BPDo | | | | | | | | 0.23 |
| BDMAPA | | | | | | | | |
| PMAN | | | | | | | | |
| Amount of amine compound added [mol %] | 10 | 10 | 1 | 10 | 10 | 10 | 10 | 10 |
| Gel time @ 25° C. [minute] | 0 | 0 | 0 | 0 | 0 | 0 | 2 | >167 |

TABLE 5

| | Molecular weight of R1 + R2 | Molecular weight | N | Amine functional group equivalent weight | Largest pK$_a$ | Example 12 | Example 13 | Example 14 | Example 15 | Example 16 | Example 17 |
|---|---|---|---|---|---|---|---|---|---|---|---|
| EPEMM | 166.22 | 248.27 | | | | | | | | | |
| 2EHEMM | 174.28 | 256.34 | | | | | | | | | |
| EOMM | 174.28 | 256.34 | | | | | | | | | |
| DCHMM | 198.30 | 280.36 | | | | | | | | | |
| DHMM | 202.33 | 284.39 | | | | 2.79 | 2.89 | 2.87 | 2.78 | 2.81 | 2.60 |
| TMG | | 115.18 | 1 | 115.18 | 13.4 | | | | | | |
| DCHMA | | 195.34 | 1 | 195.34 | 11.2 | 0.21 | | | | | |
| TEA | | 101.19 | 1 | 101.19 | 10.2 | | 0.11 | | | | |
| DABCO | | 112.17 | 2 | 56.09 | 9.8 | | | 0.13 | | | |
| TMTAU | | 201.36 | 2 | 100.68 | 9.5 | | | | 0.22 | | |
| BPDi | | 175.28 | 1 | 175.28 | 9.4 | | | | | 0.19 | 0.40 |
| DMBA | | 135.21 | 1 | 135.21 | 8.9 | | | | | | |
| BPDo | | 189.26 | 1 | 189.26 | 6.8 | | | | | | |

TABLE 5-continued

| | | | | | | | | | |
|---|---|---|---|---|---|---|---|---|---|
| BDMAPA | 255.36 | 2 | 127.68 | 6.5 | | | | | |
| PMAN | 163.26 | 1 | 163.26 | 5.8 | | | | | |
| Amount of amine compound added [mol %] | | | | | 10 | 10 | 10 | 10 | 10 | 20 |
| Gel time @ 25° C. [minute] | | | | | 85 | 19 | 0 | 0 | 136 | 110 |

| | Example 18 | Example 19 | Comparative Example 2 | Comparative Example 3 | Comparative Example 4 | Comparative Example 5 | Example 20 | Example 21 | Example 22 |
|---|---|---|---|---|---|---|---|---|---|
| EPEMM | | | | | | | 3.0036 | 2.98 | 2.89 |
| 2EHEMM | | | | | | | | | |
| EOMM | | | | | | | | | |
| DCHMM | | | | | | | | | |
| DHMM | 2.37 | 2.85 | 2.79 | 2.33 | 2.73 | 2.82 | | | |
| TMG | | | | | | | | | |
| DCHMA | | | | | | | | | |
| TEA | | | | | | | | | |
| DABCO | | | | | | | | | |
| TMTAU | | | | | | | | | |
| BPDi | 0.63 | | | | | | 0.00021 | 0.02 | 0.11 |
| DMBA | | 0.15 | | | | | | | |
| BPDo | | | 0.21 | 0.67 | | | | | |
| BDMAPA | | | | | 0.27 | | | | |
| PMAN | | | | | | 0.18 | | | |
| Amount of amine compound added [mol %] | 30 | 10 | 10 | 30 | 10 | 10 | 0.010 | 1 | 5 |
| Gel time @ 25° C. [minute] | 104 | 3 | >167 | >167 | >167 | >167 | 62 | 18 | 4 |

(Discussion on Results)

When TMG, which has a high $pK_a$ value, was added to a 2-methylene-1,3-dicarbonyl compound at a concentration of 10 mol %, all the resin compositions gelled in a very short time (Examples 1 to 5).

This was also the case when two 2-methylene-1,3-dicarbonyl compounds were used; when TMG was added to an equimolar mixture of DHMM and DCHMM at a concentration of 10 mol %, the resin composition gelled in a very short time (Example 6).

When TMG was added to DHMM, which has a relatively high molecular weight, at a concentration of 1 mol %, the resin composition also gelled in a very short period of time (Example 7).

When TEA, DABCO, TMTAU, and BPDi, which are basic substances having a $pK_a$ of 9.4 to 10.2, were added to EPEMM (molecular weight: 248.27) at a concentration of 10 mol %, all the resin compositions gelled in a short time as well (Examples 8 to 11).

Even when EPEMM, which has a relatively low molecular weight, was used, use of a basic substance having a $pK_a$ of 6.8 failed to result in gelling within 167 minutes (9,999 seconds) (Comparative Example 1).

When DCHMA, TEA, DABCO, TMTAU, BPDi and DMBA, which are basic substances having a $pK_a$ of 8.9 to 11.2, were added to DHMM (molecular weight: 284.39) at a concentration of 10 mol %, all the resin compositions gelled within 167 minutes (Examples 12 to 16 and 19).

Comparison of Examples 8 with Example 13 and Example 11 with Example 16, respectively, indicates that when the molecular weight of the 2-methylene-1,3-dicarbonyl compound exceeds 180, at least one of $R^1$ and $R^2$ in formula (IV) above preferably has 3 or less carbon atoms from the perspective of curability.

In Examples 17 and 18, the amounts of BPDi added were increased compared to Example 16, which, accordingly, resulted in slightly shorted gel times. In Example 18, in which the basic substance was added to the 2-methylene-1,3-dicarbonyl compound at a concentration of 30 mol %, bleeding was observed.

In Examples 13 to 16 and 19, basic substances having similar maximal $pK_a$s were added to the same 2-methylene-1,3-dicarbonyl compound (DHMM) at a concentration of 10 mol %. Example 16 shows that an amine functional group equivalent weight of less than 180 is preferred for gelling purposes. Further, Example 19 shows that an amine functional group equivalent weight of less than 140 results in excellent curing characteristics with an even shorter gel time. Further, Examples 13 and 15 show that, among amine compounds having similar amine functional group equivalent weights, those having an N (the number of amino groups contained in the amine compound and exhibiting the largest $pK_a$) of two or greater have superior curing characteristics with a shorter gel time.

None of the resin compositions comprising a basic substance having a $pK_a$ of less than 8 gelled within a predetermined time (Comparative Examples 2 to 5). In particular, even when the basic substance was added to the 2-methylene-1,3-dicarbonyl compound at a concentration of 30 mol %, gelation did not occur within a predetermined time (Comparative Example 3).

When EPEMM and BPDi were used in the same manner as in Example 11, the resin compositions having varying amounts (5 mol %, 1 mol %, and 0.01 mol %) of the basic substance still gelled within a predetermined time (Examples 20 to 22).

The above shows that 2-methylene-1,3-dicarbonyl compounds having a molecular weight of less than 180 have high vapor pressure in the working environment and are not suitable for use a one-part adhesive used in the manufacture of an image sensor module or an electronic component. It has been found that 2-methylene-1,3-dicarbonyl compounds having a molecular weight of 180 or greater, despite not easily undergoing a curing reaction due to the influence of steric hindrance, produce resin compositions that cure within a predetermined time if an initiator comprising a basic substance having a $pK_a$ of 8 or higher is used.

REFERENCE SIGNS LIST

10 Camera module
12 Lens
14 Voice coil motor
16 Lens unit
18 Support
20 Cutting filter
22 Image sensor
24 Printed circuit board
30, 32, 34 Adhesive

What is claimed is:

1. A one-part liquid resin composition comprising a 2-methylene-1,3-dicarbonyl compound and an initiator,
wherein the 2-methylene-1,3-dicarbonyl compound is a compound comprising a structural unit represented by formula (I) below:

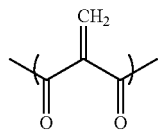

(I)

and having a molecular weight of 180 to 10,000; and
wherein the initiator comprises a basic substance having a $pK_a$ of 8 or greater.

2. The one-part liquid resin composition according to claim 1, wherein the 2-methylene-1,3-dicarbonyl compound has a molecular weight of 260 to 1,500.

3. The one-part liquid resin composition according to claim 1, wherein the initiator comprises a basic substance having a $pK_a$ of 9 or greater.

4. The one-part liquid resin composition according to claim 1, wherein the basic substance is an amine compound.

5. The one-part liquid resin composition according to claim 4, wherein the amine compound has an amine functional group equivalent weight of less than 180.

6. The one-part liquid resin composition according to claim 4, wherein the amine compound has an amine functional group equivalent weight of less than 140.

7. The one-part liquid resin composition according to claim 4, wherein the amine compound comprises a secondary or tertiary amino group.

8. The one-part liquid resin composition according to claim 4, wherein the amine compound comprises a tertiary amino group.

9. The one-part liquid resin composition according to claim 4, wherein the amine compound is liquid at 80° C.

10. The one-part liquid resin composition according to claim 4, wherein the amine compound is liquid at 25° C.

11. The one-part liquid resin composition according to claim 1, wherein the basic substance is comprised in an amount of 0.01 to 30 mol % relative to the 2-methylene-1,3-dicarbonyl compound.

12. The one-part liquid resin composition according to claim 1, for use in the manufacture of an electronic component.

13. A method for producing a semiconductor device having an electronic component and a circuit board, the method comprising:
providing the electronic component and the circuit board;
applying the one-part liquid resin composition according to claim 1 to a surface of the electronic component or the circuit board; and
contacting the electronic component and the circuit board.

14. A method for producing a sealed electronic component, the method comprising:
providing an electronic component; and
sealing the electronic component using the one-part liquid resin composition according to claim 1.

15. A method for producing an electronic component, the method comprising:
providing a plurality of members to be incorporated in the electronic component;
applying the one-part liquid resin composition according to claim 1 to a surface of a member to be incorporated in the electronic component; and
contacting the member with another member to be incorporated in the electronic component.

16. A method for producing a member to be incorporated in an electronic component, the method comprising:
providing a circuit board comprising an electronic circuit; and
applying the one-part liquid resin composition according to claim 1 onto the electronic circuit on the circuit board.

* * * * *